United States Patent
Shibata

(10) Patent No.: US 7,847,313 B2
(45) Date of Patent: Dec. 7, 2010

(54) GROUP III-V NITRIDE-BASED SEMICONDUCTOR SUBSTRATE AND GROUP III-V NITRIDE-BASED LIGHT EMITTING DEVICE

(75) Inventor: Masatomo Shibata, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 255 days.

(21) Appl. No.: 11/716,918

(22) Filed: Mar. 12, 2007

(65) Prior Publication Data

US 2008/0042160 A1  Feb. 21, 2008

(30) Foreign Application Priority Data

Aug. 17, 2006  (JP) .............................. 2006-222407

(51) Int. Cl.
*H01L 33/30*  (2010.01)

(52) U.S. Cl. ........................ 257/101; 257/609; 257/610; 257/611

(58) Field of Classification Search ................. 257/101, 257/609–611
See application file for complete search history.

(56) References Cited

U.S. PATENT DOCUMENTS

| 2002/0121646 | A1  | 9/2002  | Khare et al. |
| 2003/0205717 | A1* | 11/2003 | Khare et al. ................ 257/103 |
| 2004/0124500 | A1* | 7/2004  | Kawagoe .................... 257/548 |
| 2004/0262630 | A1* | 12/2004 | Kitaoka et al. .............. 257/189 |
| 2006/0075959 | A1* | 4/2006  | Matsubara et al. ........... 117/89 |
| 2009/0166606 | A1* | 7/2009  | Lee ............................. 257/13 |

FOREIGN PATENT DOCUMENTS

| JP | 63-102769  | 7/1988 |
| JP | 08-060369  | 3/1996 |
| JP | 11-251253  | 9/1999 |
| JP | 2001-192300 | 7/2001 |
| JP | 2002-335011 | 11/2002 |

OTHER PUBLICATIONS

"Periodic." Def. 2. Webster's II New Riverside University Dictionary. 1994.*
Yuichi Oshima et al, Preparation of Freestanding Gan Wafers by Hydride Vapor Phase Epitaxy with Void-Assisted Separation, Japanese J. Application Phys. vol. 42 (2003) pp. L1-L3, dated Jan. 15, 2003.

* cited by examiner

*Primary Examiner*—Howard Weiss
*Assistant Examiner*—Tifney L Skyles
(74) *Attorney, Agent, or Firm*—Scully, Scott, Murphy & Presser, P.C.

(57) ABSTRACT

A group III-V nitride-based semiconductor substrate is formed of a group III-V nitride-based semiconductor single crystal containing an n-type impurity. The single crystal has a periodical change in concentration of the n-type impurity in a thickness direction of the substrate. The periodical change has a minimum value in concentration of the n-type impurity not less than $5\times10^{17}$ cm$^{-3}$ at an arbitrary point in plane of the substrate.

16 Claims, 15 Drawing Sheets

(FORMATION OF Si-DOPED GaN LAYER)

43: Si-DOPED GaN LAYER
41: HETEROSUBSTRATE (FORMATION OF Ti FILM)

45: Ti FILM
43
41

(HEAT TREATMENT)

47: TiN LAYER
46: VOID LAYER
41

(FORMATION OF GaN LAYER)

48: GaN LAYER
47
46
41

(SUBSTRATE SEPERATION)

49: GaN FREESTANDING SUBSTRATE (FLATTENING OF BOTH FACES)

50: GaN FREESTANDING SUBSTRATE

GROUP III-V NITRIDE-BASED SEMICONDUCTOR SUBSTRATE AND GROUP III-V NITRIDE-BASED LIGHT EMITTING DEVICE

The present application is based on Japanese patent application No. 2006-222407, the entire contents of which are incorporated herein by reference.

BACKGROUND OF THE INVENTION

1. Field of the Invention

This invention relates to a group III-V nitride-based semiconductor substrate and, in particular, to a group III-V nitride-based semiconductor substrate that can prevent problems such as an ohmic failure of an electrode, and a characteristic failure and a reliability failure of a device. Also, this invention relates to a group III-V nitride-based light emitting device produced using the semiconductor substrate.

2. Description of the Related Art

Group III-V nitride-based semiconductor materials such as gallium nitride (GaN), indium gallium nitride (InGaN) and gallium aluminum nitride (GaAlN) have a sufficiently wide bandgap and are of direct transition type in inter-band transition. Therefore, they are a great deal researched to be applied to a short-wavelength light emitting device. Further, they have a high saturation drift speed of electron and can use two-dimensional electron gas obtained by hetero junction. Therefore, they are also expected to be applied to an electronic device.

In fabricating a semiconductor device, so-called homoepitaxial growth is generally conducted where a substrate with the same lattice constant and linear expansion coefficient as a crystal to be epitaxially grown thereon is used as a base substrate. For example, aGaAs single crystal substrate is used as a substrate for the epitaxial growth of GaAs and AlGaAs. However, a group III-V nitride-based semiconductor substrate sufficient in size and characteristics has not been developed for group III-V nitride-based semiconductor crystals such as GaN. Therefore, a single crystal sapphire has been used as a substrate for GaN growth, and GaN has been heteroepitaxially grown thereon by a vapor phase growth method such as MOVPE (metal-organic vapor phase epitaxy), MBE (molecular beam epitaxy), HVPE (hydride vapor phase epitaxy) etc.

However, since the sapphire substrate has a lattice constant different from GaN, a single crystal GaN film cannot be grown directly on the sapphire substrate. Thus, a GaN growth method is devised that uses a low temperature buffer layer technique which has been developed for hetero-growing Si etc. on the sapphire substrate. The technique is conducted such that the buffer layer of AlN or GaN is formed on the sapphire substrate at a low temperature of about 500° C., and then the GaN is grown thereon while reducing lattice distortions by the low temperature growth buffer layer.

By using the low temperature growth nitride layer as the buffer layer, the single crystal epitaxial growth of GaN can be achieved on the sapphire substrate. However, in growing the low temperature buffer layer, since the optimum range of condition settings for growth temperature and growth thickness is narrow, it is difficult to achieve good reproducibility.

Therefore, a measure may be taken that, instead of continuously growing the entire epitaxial device structure on the sapphire substrate, so-called GaN templates with only the GaN single layer grown on the sapphire substrate are produced in lump or outsourced, and then the remaining device structure is epitaxially grown on the GaN template in separate process.

However, in the templates with only the GaN grown on the sapphire substrate, even when using the low temperature buffer layer technique, the lattice mismatch between the substrate and the GaN crystal is beyond any controls so that the obtained GaN must have a dislocation density as high as $10^9$ to $10^{10}$ cm$^{-2}$. This defect becomes an obstacle to fabrication of a GaN-based device, especially LD and ultraviolet LED. Thus, the GaN templates are used exclusively for a visible-light LED and an electronic device whose device characteristics are not so seriously affected by the dislocation.

On the other hand, for LD and ultraviolet LED devices to require an epitaxial growth layer with a very low dislocation density, a method is proposed in which a substrate formed of only a GaN material is used as a crystal growth substrate and a semiconductor multilayer film composing its device part is formed on the substrate. Herein, such a crystal growth GaN substrate is referred to as "GaN freestanding substrate".

The GaN freestanding substrate is generally prepared such that a thick GaN layer with a reduced dislocation density is epitaxially grown on a hetero-substrate such as a sapphire substrate, and then the GaN layer is separated from the base hetero-substrate after growth thereof to obtain the GaN freestanding substrate.

For example, a method is proposed that, by using a so-called ELO (epitaxial lateral overgrowth) technique, a mask with openings is formed on a base substrate of sapphire etc., a GaN layer with a low dislocation density is laterally grown through the openings, and the base sapphire substrate is removed by etching etc. to obtain the GaN freestanding substrate (See, e.g., JP-A-11-251253).

Another method is also proposed that, by using a VAS (void-assisted separation) method, voids (i.e., a network of TiN thin film) are formed on a base substrate of sapphire etc., a GaN layer is grown thereon through the voids, and the GaN layer is separated at the interface between the base substrate and the GaN layer, so that both separation of the GaN substrate and reduction of the dislocation density can be achieved simultaneously (See, e.g., Y. Oshima et al., "Preparation of Freestanding GaN Wafers by Hydride Vapor Phase Epitaxy with Void-Assisted Separation.", Jpn. J. Appl. Phys. vol. 42 (2003) pp. L1-L3).

However, it is difficult to grow, directly on the "as grown" GaN substrate obtained by the above methods, an epitaxial layer for fabrication of a device since morphology such as pits and hillocks usually appears on the surface of the substrate. Therefore, the GaN substrate is generally used after the surface of the substrate is polished and mirror-finished.

In general, a bulk semiconductor crystal may have a multilayer structure that layers with a different impurity concentration are periodically stacked in the crystal growth direction (i.e., in the thickness direction of the substrate). It is assumed that the multilayer structure is caused by rotating the crystal during the crystal growth, whereby the crystal is forced to periodically pass through a region with a temperature gradient or a region with a different concentration in material or dopant, so that the crystal layers with the different impurity concentration are stacked. The behavior of the multilayer structure can be also reflected by that the impurity concentration has a constant period of amplitude to be determined by number of rotations and growth rate of the crystal, when measuring a distribution of the impurity concentration in the thickness direction of the substrate by means of SIMS etc.

Further, when the grown crystal is cut parallel to the growth direction and, subsequently, a certain kind of etching is conducted to the cut surface or an excitation light is irradiated thereto to observe its luminescence behavior, a constant period of stripe pattern can be clearly observed that is formed parallel to "crystal growth interface" which means a virtual crystal growth interface which must have existed at its observation position just when the crystal is growing at the observation position. The stripe observed is called "striation" or "growth striation". In the crystal, the shape of the crystal growth interface at the time when a specific region of the crystal grows can be left as unevenness in impurity concentration, i.e., striation line, where the history of the crystal growth interface can be checked by pursuing the transition of the line. Since the period of the stripe pattern is sometimes longer than that of the distribution of the impurity concentration, both are not always equal to each other. However, the periodical appearance of the stripe pattern reflects that a periodical change of the impurity concentration exists in the thickness direction of the substrate.

Such a striation is generally formed in the thickness direction of a compound semiconductor substrate of GaAs or InP. However, since the substrate is cut out of a bulk crystal grown from a melt, it is assumed that the striation in the thickness direction of the substrate is relatively small in difference of impurity concentration and, therefore, it does not adversely affect its device fabrication. In other words, the significant difference of the impurity concentration as described earlier is caused by that, in rotating the crystal during the crystal growth, the crystal is forced to periodically pass through a region with a temperature gradient or a region with a different concentration in material or dopant, so that such a difference can occur in the concentration of impurity to be introduced into the crystal. By contrast, in case of the crystal growth of GaAs or InP, since the crystal growth interface always contacts the common surface of the melt, it can be grown under circumstances that are significantly smaller in temperature gradient and dopant concentration gradient than GaN crystal described later.

On the other hand, since the GaN substrate is produced by the vapor phase growth method as mentioned earlier, it often grows periodically passing through the circumstances with a steep temperature gradient, different than the other compound semiconductor crystal grown from the melt. Further, the crystal growth rate at a passage position of the crystal depends on the concentration of a raw material gas existing at the position, and the concentration of an impurity to be introduced at the position depends on the concentration of a dopant gas existing at the position. However, since both of the concentrations are determined by the flow distribution of the raw material gas in the reactor, variation in both concentrations is likely to be significantly greater than the crystal grown from the melt. In spite of this, even when the raw material gas flows disproportionately in the reactor, the crystal may be apparently formed with uniformed thickness and impurity concentration by averaging based on the rotation of the crystal substrate. However, since the crystal actually grows as it passes through alternately a significantly high growth rate and a significantly low growth rate, on close investigation a structure is often found in which layers with a very large difference in impurity concentration are stacked alternately.

The carrier concentration of a semiconductor substrate is generally measured by the van der Pauw method or eddy-current measuring method. However, since these methods are only adapted to measure a carrier concentration averaged in its bulk, they are not adapted to measure a periodical distribution of the impurity concentration in the thickness direction of the substrate even when it exists.

Thus, as described above, to have a striation with a very large difference in impurity concentration can be equivalent to stack alternately a high carrier concentration layer and a low carrier concentration layer. Therefore, even when the average carrier concentration of a substrate is apparently high, problems may arise that an ohmic contact is not achieved between the substrate and an electrode attached thereto, and a device adapted to flow current perpendicularly to the substrate is subjected to an increase in operating voltage, an increase in heat generation and a reduction in reliability.

SUMMARY OF THE INVENTION

It is an object of the invention to provide a group III-V nitride-based semiconductor substrate that can achieve a performance commensurate with averaged electrical characteristics obtained by the usual measurement of its bulk crystal.

It is a further object of the invention to provide a group III-V nitride-based light emitting device using the semiconductor substrate.

Until now, among those having ordinary skill in the art, it has not been tried to determine the distribution of a carrier concentration in the thickness direction of a substrate in terms of the striation of the substrate. However, as described above, the inventor has focused attention on a point that, even when a single crystal substrate has apparently a uniform composition, an inside part thereof may have a distribution of an impurity concentration, i.e., a distribution of a carrier concentration, formed periodically in the thickness direction of the substrate. Thus, the inventor has found that the characteristics failure and reliability failure of the device caused by the attached electrode or by the internal resistivity of the substrate can be prevented by making the substrate such that the carrier concentration of a minimum carrier concentration layer in the thickness direction of the substrate is controlled to be not less than a specific value.

Further, the inventor has focused attention on a point that, by rotating the crystal substrate during the crystal growth, a difference in amplitude (i.e., a difference between the minimum carrier concentration and the maximum carrier concentration) of the carrier concentration in a striation in plane of the substrate is caused between a near side and a far side in relation to the rotation center. Thus, the inventor has found that, even when the average carrier concentration is apparently uniform in plane of the surface, the difference in amplitude may cause a difference in operation performance of the device formed on the substrate.

As such, the invention is devised based on the above knowledge from the novel viewpoints that are never considered by those having ordinary skill in the art.

(1) According to one embodiment of the invention, a group III-V nitride-based semiconductor substrate comprises:

a group III-V nitride-based semiconductor single crystal containing an n-type impurity, wherein the single crystal comprises a periodical change in concentration of the n-type impurity in a thickness direction of the substrate, and the periodical change comprises a minimum value in concentration of the n-type impurity not less than $5 \times 10^{17}$ cm$^{-3}$ at an arbitrary point in plane of the substrate.

(2) According to another embodiment of the invention, a group III-V nitride-based light emitting device comprises:

the group III-V nitride-based semiconductor substrate according to (1), and an active layer formed on the substrate, the active layer comprising a group III-V nitride-based semiconductor.

In the above invention (1) or (2), the following modifications and changes can be made.

(i) The periodical change comprises an amplitude being not more than $2 \times 10^{18}$ cm$^{-3}$ at an arbitrary point in plane of the substrate.

(ii) The group III-V nitride-based semiconductor single crystal comprises a hexagonal gallium nitride.

(iii) The substrate comprises on a surface thereof a gallium face on a C-face of the hexagonal gallium nitride.

(iv) The substrate comprises a mirror-polished surface.

(v) The n-type impurity comprises silicon.

(vi) The n-type impurity comprises oxygen.

(vii) The substrate comprises a diameter not less than 50 mm.

Advantages

In accordance with an embodiment of the invention, a group III-V nitride-based semiconductor substrate can prevent problems such as an ohmic failure of an electrode, and a characteristics or reliability failure of a device, caused by that, although the average carrier concentration of the substrate is sufficiently high, the distribution of the impurity concentration has a periodical change in the depth direction of the substrate (i.e., a periodical structure is formed with a low concentration layer and a high concentration layer, and the low concentration layer exists). As a result, the group III-V nitride-based semiconductor substrate can be operated as designed and produced at a good production yield.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Freestanding Substrate

Figure 1:
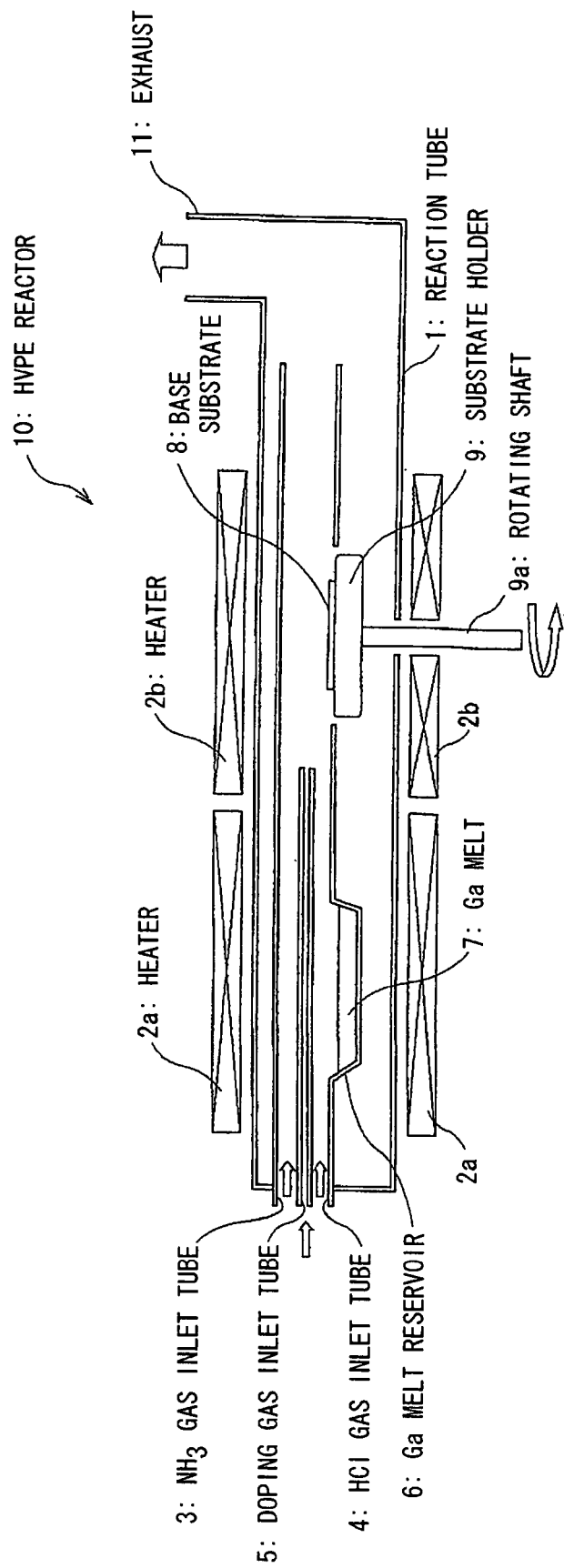
FIG. 1 is a cross sectional view showing a conventional HVPE reactor used for a crystal growth.

"Freestanding substrate" in the invention means a substrate having such strength that it can retain its shape by itself and it has no problems in its handling. It is preferred that the freestanding substrate is not less than 200 μm in thickness so as to have the strength. It is also preferred that it is not more than 1 mm in thickness in consideration of easiness in cleavage after being formed into a device. If the thickness is too thick, it becomes difficult to cleave so that roughness is generated on the cleaved surface. As a result, a decrease in device characteristics caused by a reflection loss becomes problematic, for example, when it is applied to a semiconductor laser. Further, it is preferred that a diameter thereof is not less than 50 mm.

Group III-V Nitride-Based Semiconductor

A group III-V nitride-based semiconductor of the invention includes semiconductors represented by a formula: $In_xGa_yAl_{1-x-y}N$ ($0 \leq x \leq 1$, $0 \leq y \leq 1$, $0 \leq x+y \leq 1$). Of them, gallium nitride (GaN) is most preferable since it satisfies characteristics, such as strength and production stability, required for substrate materials. Further, it is preferred that a surface of the substrate is a group III face (i.e., Ga face) as (0001) face, since a GaN-based crystal is strong in polarity and the group III face (i.e., Ga face) is chemically and thermally more stable than a group IV face (i.e., nitrogen face) to facilitate the fabrication of a device.

Surface of Substrate

In general, on the surface of a GaN base epitaxial substrate as grown, large irregularities such as hillocks or minute irregularities which may be caused by step bunching exist numerously. These cause not only an unevenness in morphology, film thickness, composition etc. when an epi-layer is grown thereon, but also a reduction in exposure precision in photolithography of the device fabrication process. Therefore, it is preferred that the surface of the substrate is polished into a mirror plane. However, a work damage layer may be left on the polished surface of the substrate. It is preferred that the work damage layer after the polishing is removed by wet etching, dry etching, distortion removal annealing etc. since dislocation density is increased by not only a dislocation generated by "grown-in" (during the crystal growth), but also a dislocation introduced after the crystal growth by the polishing etc. Thereby, the dislocation density can be reduced and a substrate can be obtained which is difficult to have a rough surface. It is deservingly preferred that the surface of the substrate after the polishing is flat, and it is preferred that roughness thereof is not more than 10 nm in arithmetic average roughness Ra measured in the range of 50 µm. Meanwhile, for a visible-light LED substrate, a substrate (called "as-grown" substrate) as obtained by the crystal growth may be directly used since a fine processing is not so required for it and there is a tendency to think a great deal of lower cost.

Back Surface of Substrate

In general, a GaN-based freestanding substrate is produced such that a layer grown hetero-epitaxially on a hetero-base substrate is separated from the base substrate by some method. Therefore, the back surface of the substrate as-separated is often roughened like a frosted glass or stained with a part of the base substrate. It may be not flat due to the warpage of the substrate. These may cause unevenness in distribution of the substrate temperature when an epitaxial layer is grown on the substrate. Thereby, uniformity or repeatability of the epitaxial layer deteriorates. Thus, it is generally preferred that the back surface of the substrate is polished into a flat surface.

N-Type Impurity for Substrate

An n-type impurity used for the substrate can be Ge, Se and S as well as Si and O.

Carrier Concentration

A difference in impurity concentration in the thickness direction of the substrate becomes problematical when the GaN substrate is used for a light-emitting device, such as LED and LD, which operates by feeding current perpendicular to the substrate. The substrate in this use is required to have a carrier concentration of not less than $5 \times 10^{17}$ cm$^{-3}$ in terms of easiness in attaching an electrode thereto when fabricating the device, and reduction in contact resistivity between the substrate and the electrode or in resistivity of the substrate when feeding the current.

However, this carrier concentration is apparently an average carrier concentration. Until now, among those having ordinary skill in the art, it has not been tried to determine the distribution of a carrier concentration in the thickness direction of a substrate in terms of the striation of the substrate. The inventor has focused attention on a point that, even when a single crystal substrate has apparently a uniform composition, an inside part thereof may have a distribution of an impurity concentration, i.e., a distribution of a carrier concentration, formed periodically in the thickness direction of the substrate. Thus, the inventor has found that the characteristics failure and reliability failure of the device caused by the attached electrode or by the internal resistivity of the substrate can be prevented by making the substrate such that the carrier concentration of a minimum carrier concentration layer in the thickness direction of the substrate is controlled to be not less than $5 \times 10^{17}$ cm$^{-3}$.

Amplitude of Carrier Concentration

Further, the inventor has focused attention on a point that, by rotating the crystal substrate during the crystal growth, a difference in amplitude (i.e., a difference between the minimum carrier concentration and the maximum carrier concentration) of the carrier concentration in a striation in plane of the substrate is caused between a near side and a far side in relation to the rotation center. Thus, the inventor has found that, even when the average carrier concentration is apparently uniform in plane of the surface, the difference in amplitude may cause a difference in operation performance of the device formed on the substrate.

It is preferred that the amplitude is not more than $2 \times 10^{18}$ cm$^{-3}$ at an arbitrary point in plane of the substrate. The reason why the amplitude range is thus determined is that, if the amplitude is more than $2 \times 10^{18}$ cm$^{-3}$, the maximum carrier concentration in plane of the substrate exceeds $2.5 \times 10^{18}$ cm$^{-3}$, where the performance of the device begins to lower due to deterioration in crystalline quality of the substrate.

Measuring Method of Carrier Concentration

The GaN substrate for light-emitting devices is typically a Si-doped or O-doped n-type substrate. As described earlier, the carrier concentration of a semiconductor substrate is often measured as averaged bulk information, and it is difficult to accurately measure a distribution of the carrier concentration in the striation. However, since the abovementioned n-type dopants (Si, O) has an activation rate of about 100% in the GaN crystal, the distribution of the carrier concentration in the striation can be determined almost accurately by measuring the distribution of a dopant concentration in the thickness direction of the substrate. The dopant concentration can be easily measured by SIMS analysis which is in wide use.

Control Method of Carrier Concentration

As described earlier, the substrate should be grown such that the carrier concentration of the minimum carrier concentration layer in the thickness direction of the substrate be not less than $5 \times 10^{17}$ cm$^{-3}$ and the amplitude of the carrier concentration at an arbitrary point in plane of the substrate be not more than $2 \times 10^{18}$ cm$^{-3}$. The growth conditions for obtaining such a substrate can be determined by that optimum conditions are selected from proper combinations of a crystal growth rate and number of crystal rotations after uniforming the temperature distribution inside the crystal growth reactor and uniforming the flow of the source gases and dopant gas, and that the selected optimum conditions are checked whether to meet the target distribution of impurity concentration (i.e., the carrier concentration of the minimum carrier concentration layer and the amplitude of the carrier concentration) by the SIMS analysis. Thus, the crystal growth conditions cannot be specified unambiguously since it depends on the reactor used and there are many optimum conditions depending on the combination of the parameters as described above.

Production Method of Substrate

The group III-V nitride-based semiconductor substrate of the invention can be obtained by growing a single crystal of group III-V nitride-based semiconductor on the hetero-substrate and then separating the crystal from the hetero-substrate. It is preferred that the single crystal of group III-V nitride-based semiconductor is grown by HVPE. This is because the HVPE is fast in crystal growth rate and therefore suited to produce a substrate required to grow a thick film. HVPE reactors to be used in producing the GaN freestanding substrate will be explained below.

HVPE Reactor

FIG. 1 is a cross sectional view showing a conventional HVPE reactor used for the crystal growth of a GaN freestanding substrate.

The HVPE reactor 10 is a hot-wall type reactor which has a reaction tube 1 elongated horizontally and formed of quartz, and a raw material heater 2a and a crystal growth region heater 2b which are disposed outside the tube 1. The HVPE reactor 10 comprises, on the left side of the reaction tube 1 (i.e., upstream of the reaction tube 1), an NH$_3$ (ammonia) gas inlet tube 3 to introduce NH$_3$ gas as a group V source, a HCl (hydrochloric) gas inlet tube 4 to introduce HCl gas for forming GaCl as a group III source, and a doping gas inlet tube 5 to introduce a dopant gas for controlling electrical conductivity.

The HCl gas inlet tube 4 has midway a Ga melt reservoir 6 formed by enlarging a diameter thereof so as to store a gallium melt 7 which is provided by melting a metal gallium. Further, nearly at the center of the reaction tube 1, a substrate holder 9 is disposed which allows a base substrate 8 to be mounted on and which can be rotated around a rotating shaft 9a attached to the holder 9. Further, on the right side of the reaction tube (i.e., downstream of the reaction tube 1), an exhaust 11 is disposed which allows an exhaust gas to be discharged outside.

In growing the GaN by using the HVPE reactor 10, the raw material heater 2a is heated to 800° C., the crystal growth region heater 2b is heated to 1000° C., and the Ga melt reservoir 6 is heated to a temperature higher than the melting point of Ga to melt the metal gallium into the gallium melt 7.

Then, $NH_3$ gas as a group V source is introduced through the $NH_3$ gas inlet tube 3, HCl gas for forming the group III source is introduced through the HCl gas inlet tube 4, and a dopant containing gas is introduced through the doping gas inlet tube 5. In terms of the control of reactivity, the HCl gas and the $NH_3$ gas as a source gas are introduced while being mixed with a carrier gas such as $H_2$ gas. Depending on growth conditions, the GaN crystal containing an n-type impurity can be grown without introducing the doping gas since in the HVPE growth Si may be often contaminated from the quartz material inside of the reactor.

In the HCl gas inlet tube 4, the HCl gas midway contacts the gallium melt 7 to produce GaCl gas based on a reaction represented by: $Ga+HCl \rightarrow GaCl+(1/2) H_2$.

A mixed gas of the GaCl gas and the carrier gas $H_2$ and a mixed gas of the $NH_3$ gas and the carrier gas $H_2$ are flown in the inner space of the reaction tube 1 along arrowed lines as shown in FIG. 1, so that a reaction represented by: $GaCl+NH_3 \rightarrow GaN+HCl+H_2$ is caused on the base substrate 8 placed on the substrate holder 9 to deposit GaN on the base substrate 8.

The base substrate 8 as a base for the crystal growth is fixed onto the substrate holder 9 supported by the rotating shaft 9a, and is rotated during the crystal growth. The gases introduced into the reaction tube 1 are led to a detoxification facility (not shown) through the downstream exhaust 11 and are then discharged into the air after the detoxification treatment.

Improvement of HVPE Reactor

Figure 2:
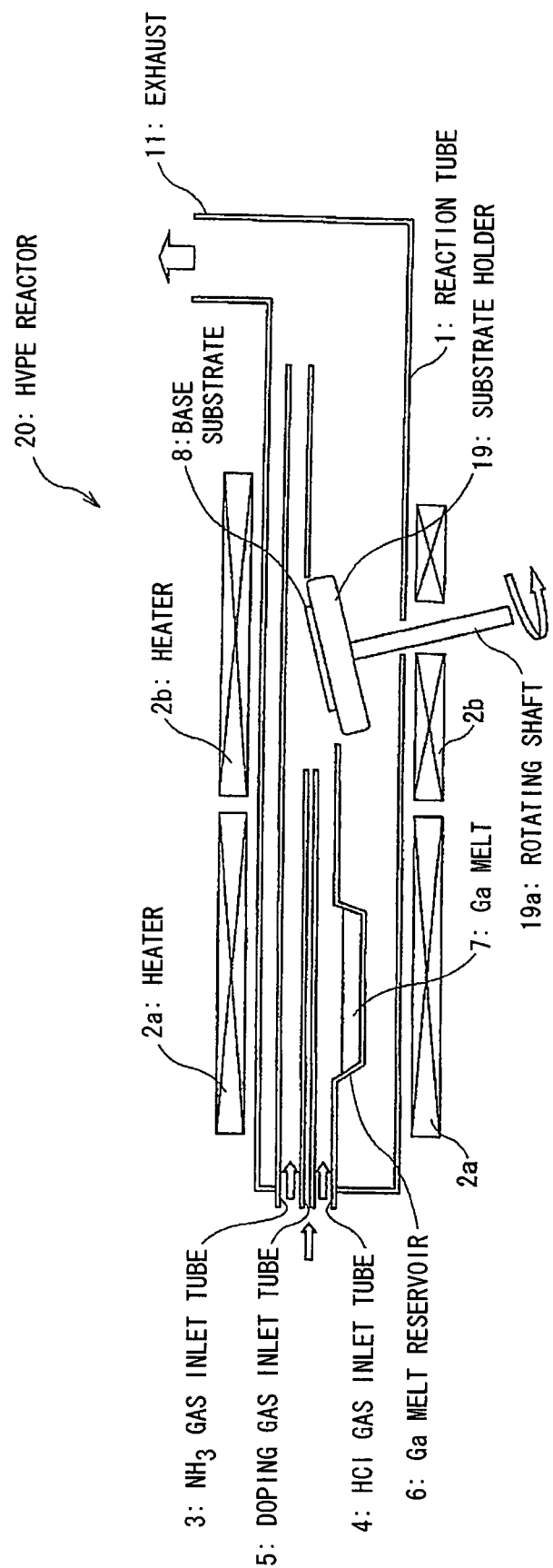
FIG. 2 is a cross sectional view showing an improvement of the HVPE reactor shown in FIG. 1.

The HVPE reactor can be improved as shown in FIG. 2. An improved HVPE reactor 20 is different than the HVPE reactor 10 as shown in FIG. 1 in that a substrate holder 19 and a rotating shaft 19a supporting rotatably the substrate holder 19 are inclined at a angle of 10° relative to the flow direction of the source gases. In this structure, as the source gas goes downstream, the flow path of the source gas has a narrower cross sectional area, where the flow rate of the source gas can be increased. By this function, a reduction in source gas concentration caused by the preceding consumption of the GaCl gas on the upstream side can be cancelled to prevent a reduction in growth rate from upstream to downstream of the gas flow (See FIG. 5 detailed later).

Modification of HVPE Reactor

Figure 3:
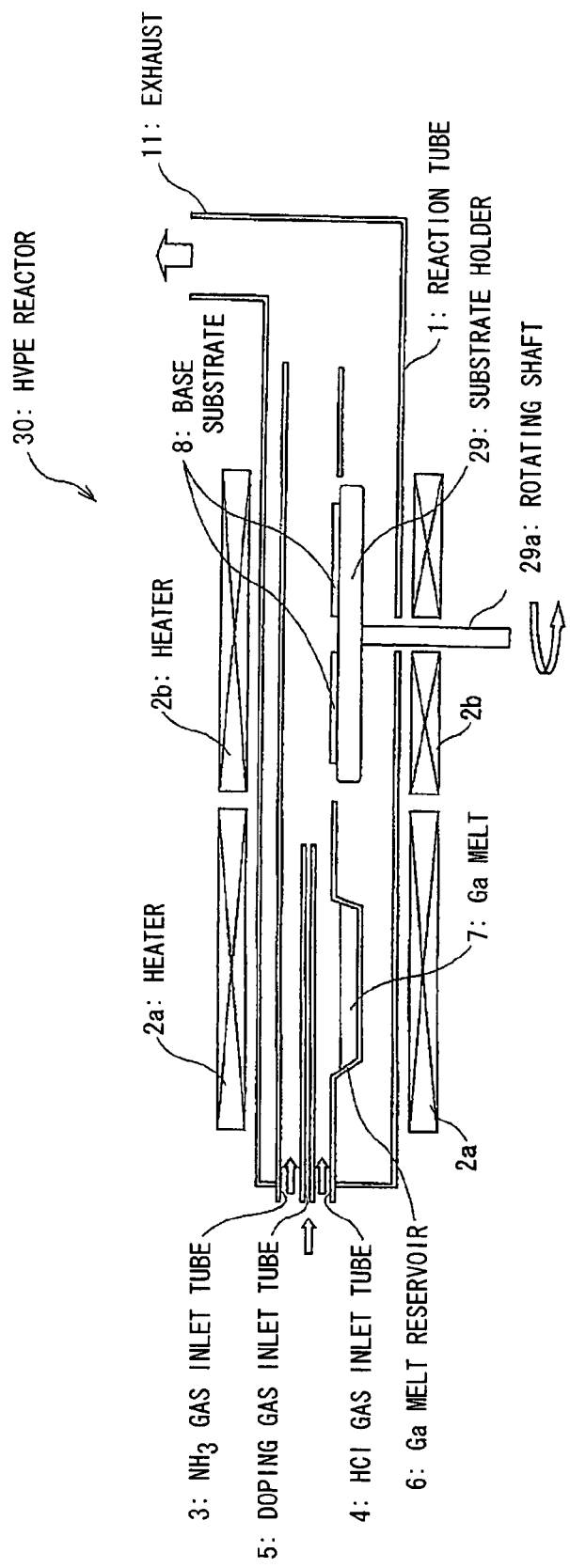
FIG. 3 is a cross sectional view showing a modification of the HVPE reactor shown in FIG. 1.

The HVPE reactor can be modified as shown in FIG. 3. A modified HVPE reactor 30 is different than the HVPE reactor 10 as shown in FIG. 1 in that a substrate holder 29 supported rotatably on a rotating shaft 29a is formed of a simultaneous multi-growth type on which three substrates (i.e., three base substrates 8) with a diameter of 2 inches can be placed. The substrate holder 29 can be rotated around the rotating shaft 29a, but each of the base substrates 8 is not rotated. Thus, the HVPE reactor 30 is different than the HVPE reactor as shown in FIG. 1 in that the base substrates 8 each does not rotate on its axis, but they move around the rotating shaft 29a during the HVPE growth.

Separation Method from the Base Substrate

After the crystal growth, the GaN-based semiconductor single crystal can be separated from the base substrate by using VAS (void-assisted separation) method etc. The VAS method is excellent in that it can separate a grown substrate with a large diameter at good reproducibility as well as obtaining a GaN freestanding substrate with low dislocation and uniform characteristics. The VAS method will be explained below referring to FIG. 4.

VAS Method

Figure 4A:
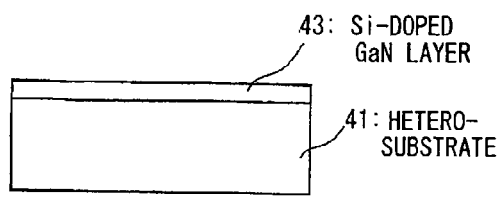
FIG. 4A is across sectional view showing a method of making a GaN substrate (VAS method), where a Si-doped GaN layer is formed.

In the VAS method, at first, aGaN layer 43 (e.g., Si-doped GaN layer) with a thickness of about 0.5 µm is grown through a low temperature growth GaN buffer layer (not shown) on a hetero-substrate 41 such as a sapphire substrate by the MOVPE (See FIG. 4A).

Figure 4B:
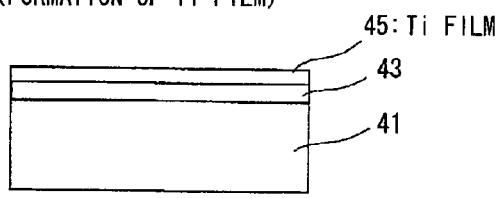
FIG. 4B is a cross sectional view showing the method of making the GaN substrate (VAS method), where a Ti film is formed.

Then, a metal Ti film 45 is deposited about 20 nm thick on the GaN layer 43 (See FIG. 4B).

Then, the substrate is placed in an electric oven (not shown) and heat-treated at about 1050° C. in a hydrogen gas stream containing ammonia gas. Thereby, a part of the GaN layer 43 is etched to provide a void layer 46 with voids formed densely, and the Ti film 45 is nitrided into a TiN layer 47 with a mesh structure that submicron-sized holes are densely formed on its surface (See FIG. 4C).

Figure 4C:
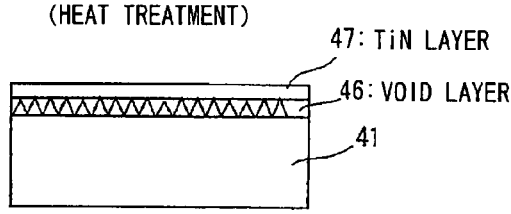
FIG. 4C is a cross sectional view showing the method of making the GaN substrate (VAS method), where heat treatment is conducted.
Figure 4D:
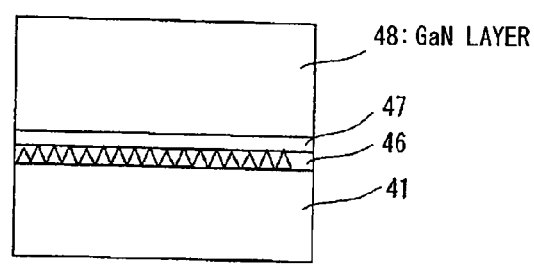
FIG. 4D is a cross sectional view showing the method of making the GaN substrate (VAS method), where a GaN layer is formed.

Then, the substrate as a base substrate is placed in the HVPE reactor as shown in FIGS. 1 to 3, and a thick GaN layer 48 is grown on the substrate (See FIG. 4D).

Figure 4E:
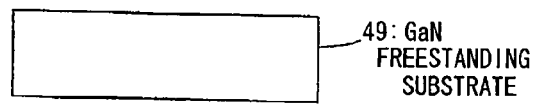
FIG. 4E is a cross sectional view showing the method of making the GaN substrate (VAS method), where the GaN layer as a freestanding substrate is separated from a base substrate.

In process of cooling the HVPE reactor, the thick GaN layer 48 is naturally, at the void layer 46 as a boundary, separated from the base substrate to provide a GaN freestanding substrate 49 (See FIG. 4E).

Figure 4F:
FIG. 4F is a cross sectional view showing the method of making the GaN substrate (VAS method), where the GaN freestanding substrate is flattened on both sides.

Finally, both surfaces of the substrate 49 are flattened (by polishing etc.) to provide a GaN freestanding substrate 50 (See FIG. 4F).

GaN-Based Light Emitting Device

The GaN freestanding substrate thus obtained can be suitably used to epitaxially grow a group III-V nitride-based semiconductor crystal by the MOVPE thereon to provide an LED.

Embodiments

A group III-V nitride-based semiconductor substrate and a group III-V nitride-based light emitting device according to the invention will be exemplified based on Examples 1 to 3 and Comparative Examples 1 to 2 as below, although not limited to Examples 1 to 3.

Making Base Substrate by VAS Method

First, a base substrate (i.e., a void-formed GaN template) used in Comparative Examples 1 to 2 and Examples 1 to 3 as described below was made by the VAS method.

As shown in FIG. 4A, the Si-doped GaN layer 43 was grown 0.5 µm thick on a sapphire C-face just substrate (i.e., hetero-substrate 41) with a diameter of 2 inches by MOVPE through a 20 nm thick low temperature growth GaN buffer layer (not shown). The growth pressure was set normal pressure, the substrate temperature in the growth of the buffer layer was set 600° C., and the substrate temperature in the growth of the epitaxial layer was set 1100° C. Trimethylgallium (TMG) was used as a group III source, ammonia ($NH_3$) was used as a group V source, and silane was used as a dopant. Further, a mixed gas of hydrogen and nitrogen was used as a carrier gas. The crystal growth rate was 4 µm/h. The carrier concentration of the epitaxial layer was set $2 \times 10^{18}$ $cm^{-3}$.

Then, the metal Ti film 45 was deposited 20 nm thick on the GaN layer 43 (FIG. 4B). Then, the base substrate thus obtained was placed in the electric oven and heat-treated at 1050° C. for 20 minutes in the hydrogen gas stream containing 20% ammonia. As a result, a part of the GaN layer 43 was etched to provide the void layer 46 with voids formed densely, and the Ti film 45 was nitrided into the TiN layer 47 with a mesh structure that submicron-sized holes were densely formed on its surface (FIG. 4C). All of Comparative Examples 1 to 1 and Examples 1 to 3 as described below were performed by using the base substrate (i.e., the void-formed GaN template) thus obtained.

COMPARATIVE EXAMPLE 1

(where the minimum value of the impurity concentration is less than $5 \times 10^{17}$ cm$^{-3}$, and the in-plane amplitude is more than $2 \times 10^{18}$ cm$^{-3}$ at a point 20 mm away from the center of the substrate)

By using the HVPE reactor 10 as shown in FIG. 1, a thick GaN layer was grown on the void-formed GaN template (i.e., the base substrate 8). The HVPE growth conditions were as follows. A supply gas containing a source gas of $8 \times 10^{-3}$ atm gallium chloride and $4.8 \times 10^{-2}$ atm ammonia in the carrier gas was used to grow the GaN layer with a target thickness. Nitrogen gas containing 5% hydrogen was used as the carrier gas. The growth pressure was set normal pressure and the substrate temperature was set 1000° C. Further, in the growth process of the GaN crystal, silicon was doped by supplying dichlorosilane as a doping gas to the substrate region.

Evaluations of Substrate

Figure 5:
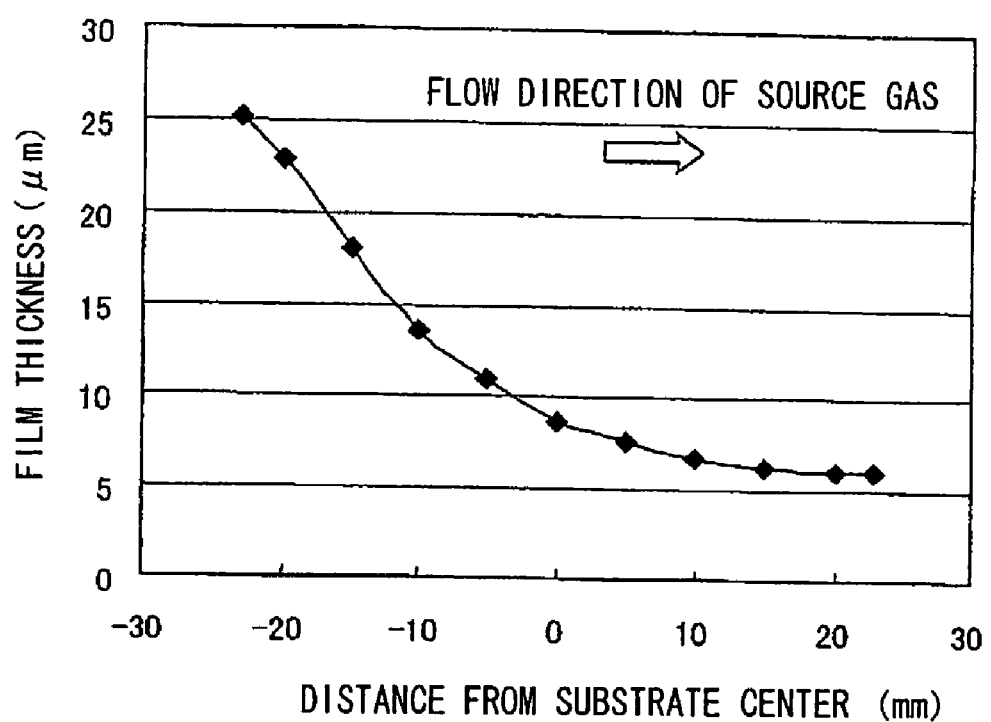
FIG. 5 is a graph showing a distribution in thickness of a GaN film grown by HVPE without rotating a base substrate in Comparative Example 1.
Figure 6:
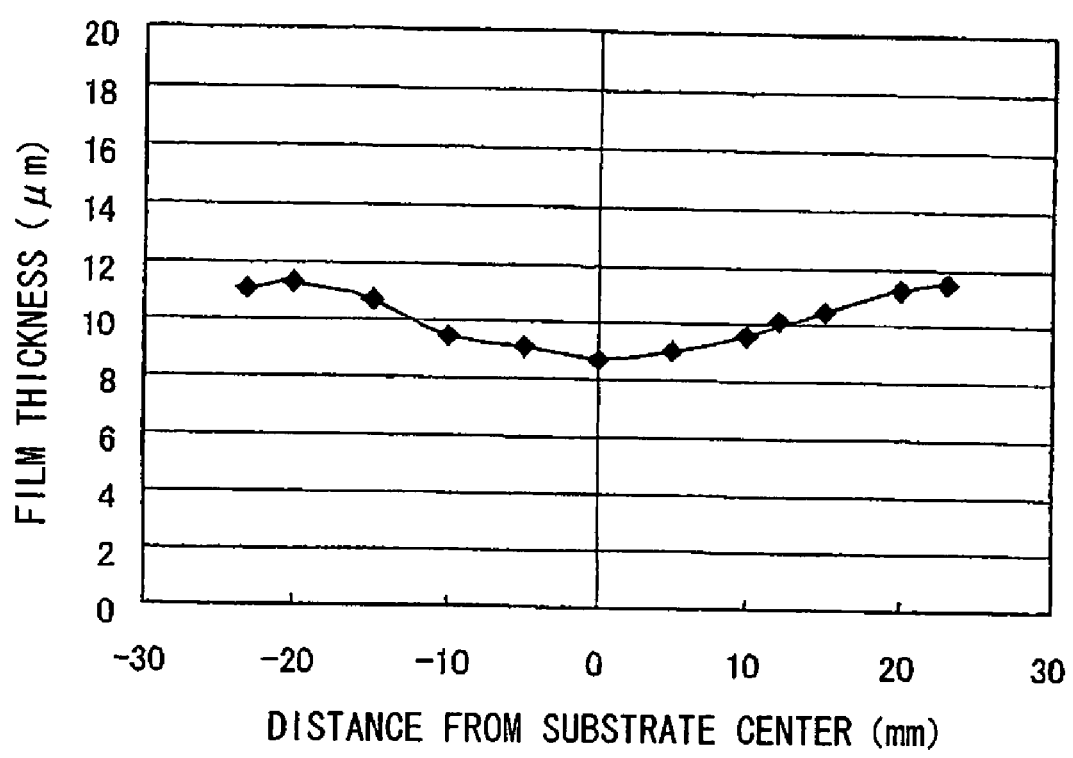
FIG. 6 is a graph showing a distribution in thickness of a GaN film grown by HVPE while rotating the base substrate in Comparative Example 1.

FIGS. 5 and 6 are graphs showing a distribution of the film thickness of a GaN crystal grown by using the HVPE reactor 10 as shown in FIG. 1.

In case of FIG. 5, the GaN crystal is grown intentionally without rotating the substrate so as to confirm a distribution of the growth rate in the flow direction of the raw material gas. In this growth condition, plenty of the ammonia gas enough to the molar flow rate of gallium chloride is flown so that the growth rate of GaN can be controlled by the supply of gallium chloride. Since the gallium chloride is exhausted during the crystal growth of GaN, the source concentration (GaCl) lowers as it goes downstream. Thus, the growth rate is decreased. FIG. 5 shows that, in the above growth conditions, the growth rate is decreased to about ⅕ within 50 mm, which corresponds to the diameter of the substrate.

FIG. 6 is a graph showing a distribution of the film thickness of the GaN crystal grown rotating the base substrate at 10 rpm under the same growth conditions as described above. By rotating the base substrate, the difference between the upstream and downstream growth rates in the source gas flow is averaged so that the surface can be significantly flattened.

Under the growth conditions as described above, rotating the substrate at 10 rpm, the GaN layer 48 was grown 600 μm in central film thickness (FIG. 4D). Then, the GaN freestanding substrate 49 was separated from the base substrate (FIG. 4E). Then, both surfaces of the substrate 49 were lapped and mirror-polished to provide the GaN freestanding substrate 50 with a thickness of 430 μm (FIG. 4F).

Nine samples with a size of 5 mm square were cut linearly along the diameter of the substrate 50, and they were each provided with In (indium) electrodes to measure the carrier concentration by the van der Pauw method. As the result of the measurement, the measured values fell within $1.1 \pm 0.1 \times 10^{18}$ cm$^{-3}$.

Figure 7:
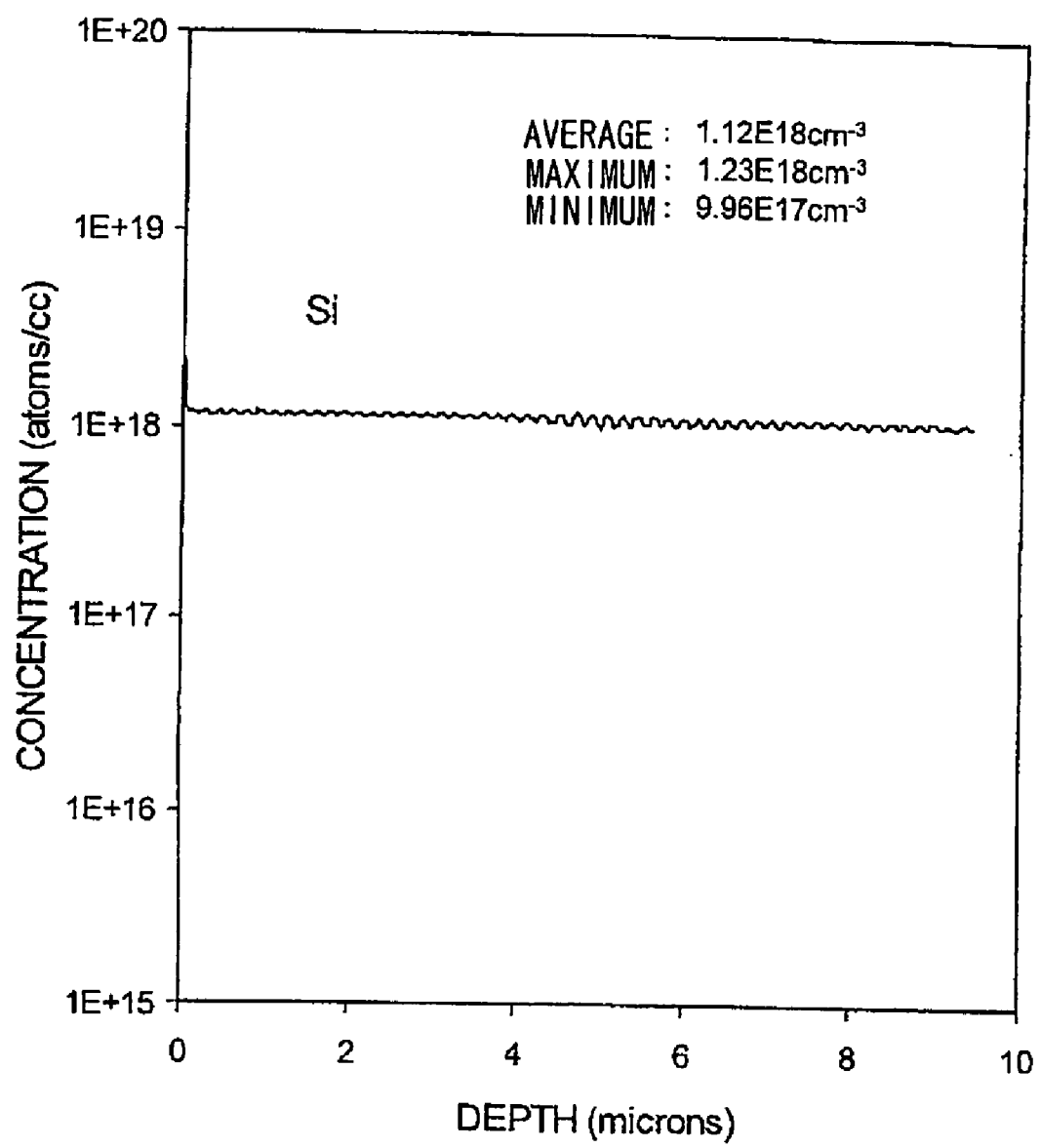
FIG. 7 is a graph showing a Si concentration profile at the central of a GaN freestanding substrate crystal produced in Comparative Example 1.
Figure 8:
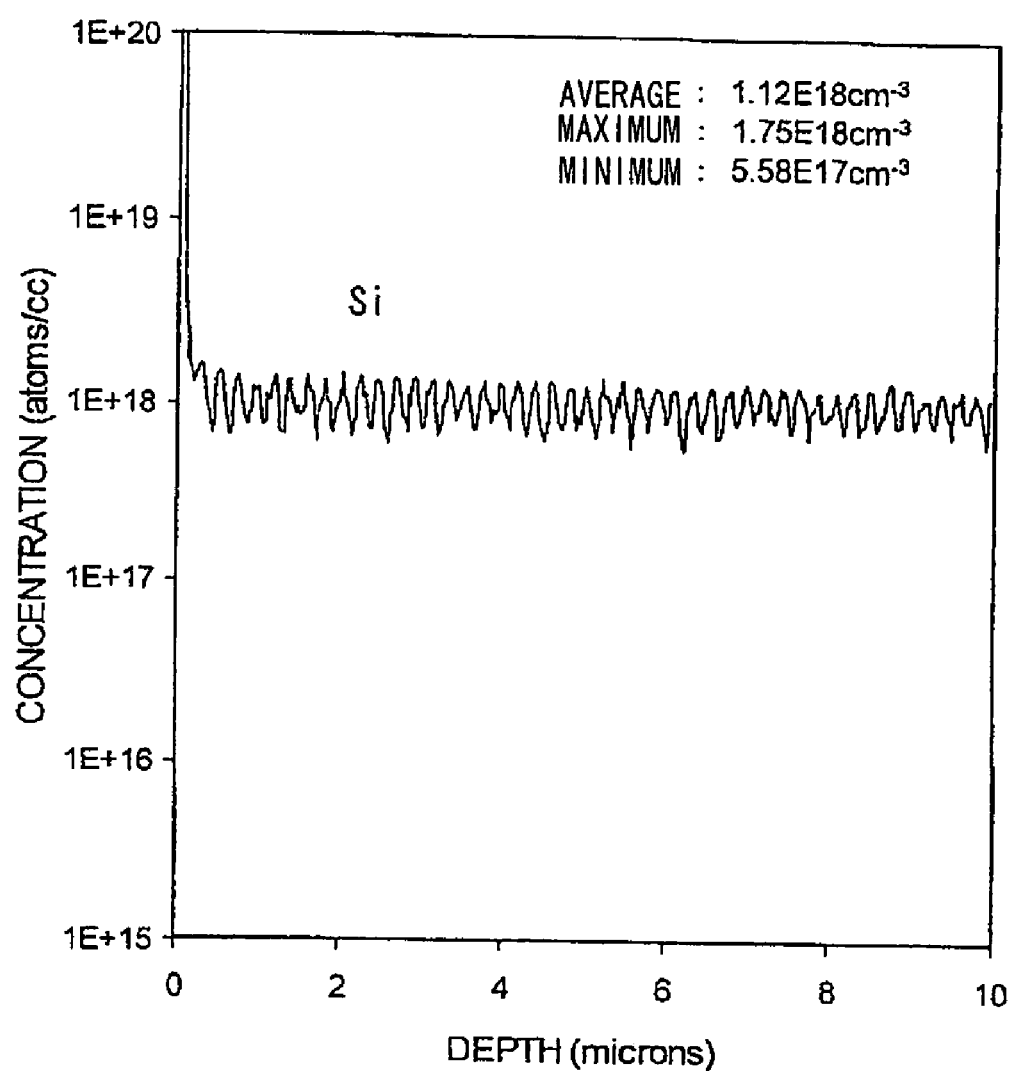
FIG. 8 is a graph showing a Si concentration profile at a point 10 mm away from the center of the GaN freestanding substrate crystal produced in Comparative Example 1.
Figure 9:
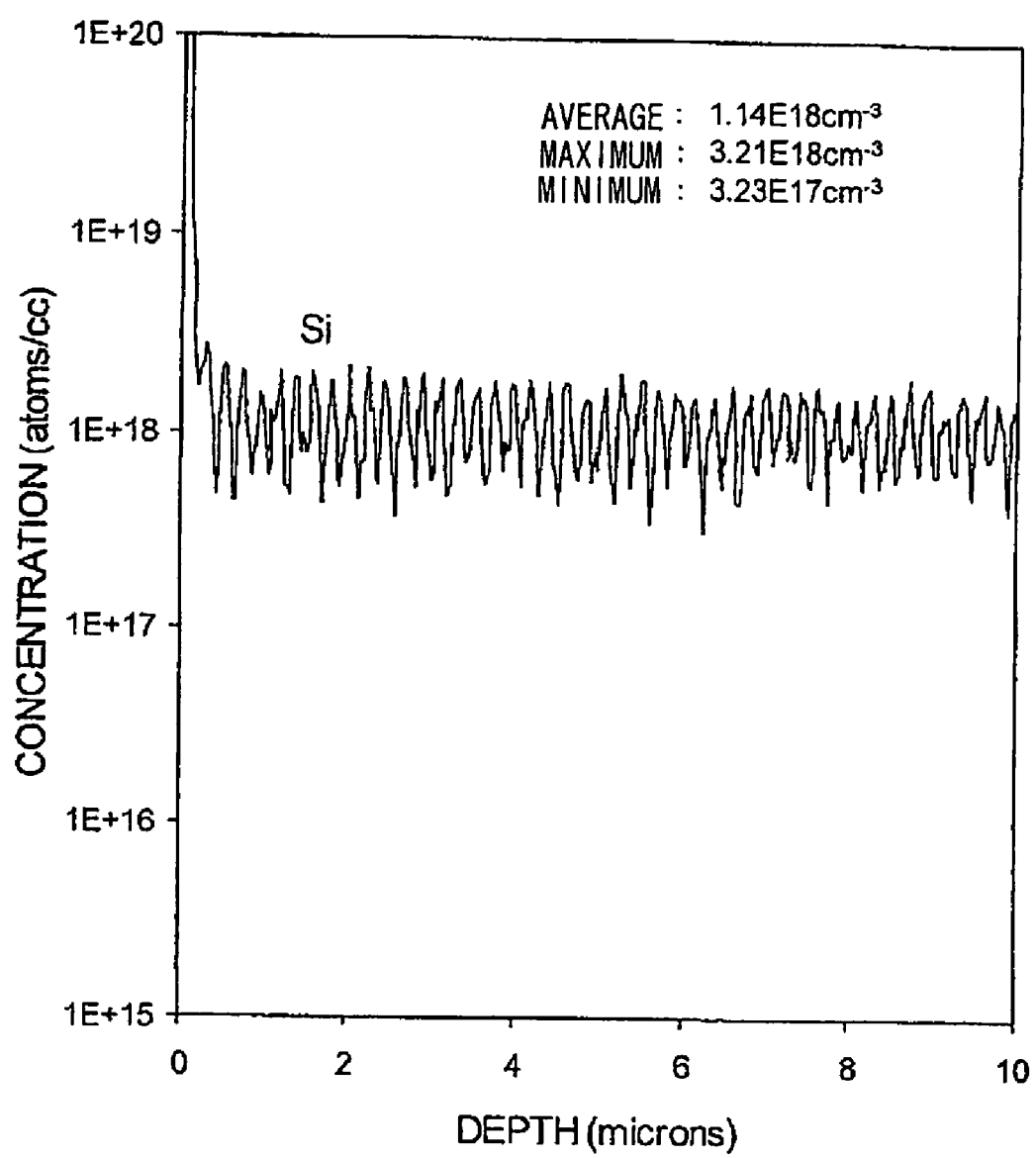
FIG. 9 is a graph showing a Si concentration profile at a point 20 mm away from the center of the GaN freestanding substrate crystal produced in Comparative Example 1.

Next, a Si concentration distribution in the thickness direction of the substrate was measured for samples which were cut at the center of the substrate, at a point 10 mm away from the center, and at a point 20 mm away from the center. FIGS. 7 to 9 show the SIMS measurement results at the center of the substrate, at a point 10 mm away from the center, and at a point 20 mm away from the center, respectively.

FIG. 7 is a graph showing a profile of the Si concentration at the center of the GaN freestanding substrate. With respect to the in-depth distribution of the Si concentration measured for the sample cut at the central of the substrate, there was not a big variation. In measurement down to about 10 μm depth, the maximum value was $1.23 \times 10^{18}$ cm$^{-3}$, the minimum value was $9.96 \times 10^{17}$ cm$^{-3}$, and the average value was $1.12 \times 10^{18}$ cm$^{-3}$. Assuming that an amplitude in variation of the Si concentration is determined by (the maximum concentration)–(the minimum concentration), the amplitude is $2.34 \times 10^{17}$ cm$^{-3}$.

FIG. 8 is a graph showing a profile of the Si concentration at a point 10 mm away from the center of the GaN freestanding substrate. With respect to the in-depth distribution of the Si concentration measured for the sample cut at the point 10 mm away from the center of the substrate, the change was slightly greater than that at the center of the substrate. In measurement down to about 10 μm depth, the maximum value was $1.75 \times 10^{18}$ cm$^{-3}$, the minimum value was $5.58 \times 10^{17}$ cm$^{-3}$, and the average value was $1.12 \times 10^{18}$ cm$^{-3}$. Thus, the amplitude of the Si concentration at this measurement point is $1.19 \times 10^{18}$ cm$^{-3}$.

FIG. 9 is a graph showing a profile of the Si concentration at a point 20 mm away from the center of the GaN freestanding substrate. With respect to the in-depth distribution of the Si concentration measured for the sample cut at the point 10 mm away from the center of the substrate, the change was further greater than that at the center of the substrate. In measurement down to about 10 μm depth, the maximum value was $3.21 \times 10^{18}$ cm$^{-3}$, the minimum value was $3.23 \times 10^{17}$ cm$^{-3}$, and the average value was $1.14 \times 10^{18}$ cm$^{-3}$. Thus, the amplitude of the Si concentration at this measurement point is $2.89 \times 10^{18}$ cm$^{-3}$.

Thus, it can be concluded that this substrate is not more than about $2.89 \times 10^{18}$ cm$^{-3}$ in amplitude of the Si concentration at any points in plane of the surface.

Meanwhile, in the SIMS measurement, an abnormal impurity concentration may be measured on the outermost surface of the substrate due to an adsorption impurity etc. Also, when measured at a specific point that a crystal defect etc. exists, an impurity concentration at that point may be measured significantly different than that in a mother phase composing most part of the substrate. Therefore, herein, values measured at a point except these specific points are taken as valid measurement data. For example, the impurity concentration values as described above are taken excepting a high measurement value that seems to be clearly affected by the surface condition of the substrate. Same applies to Examples as below.

Evaluations of LED

Figure 10:
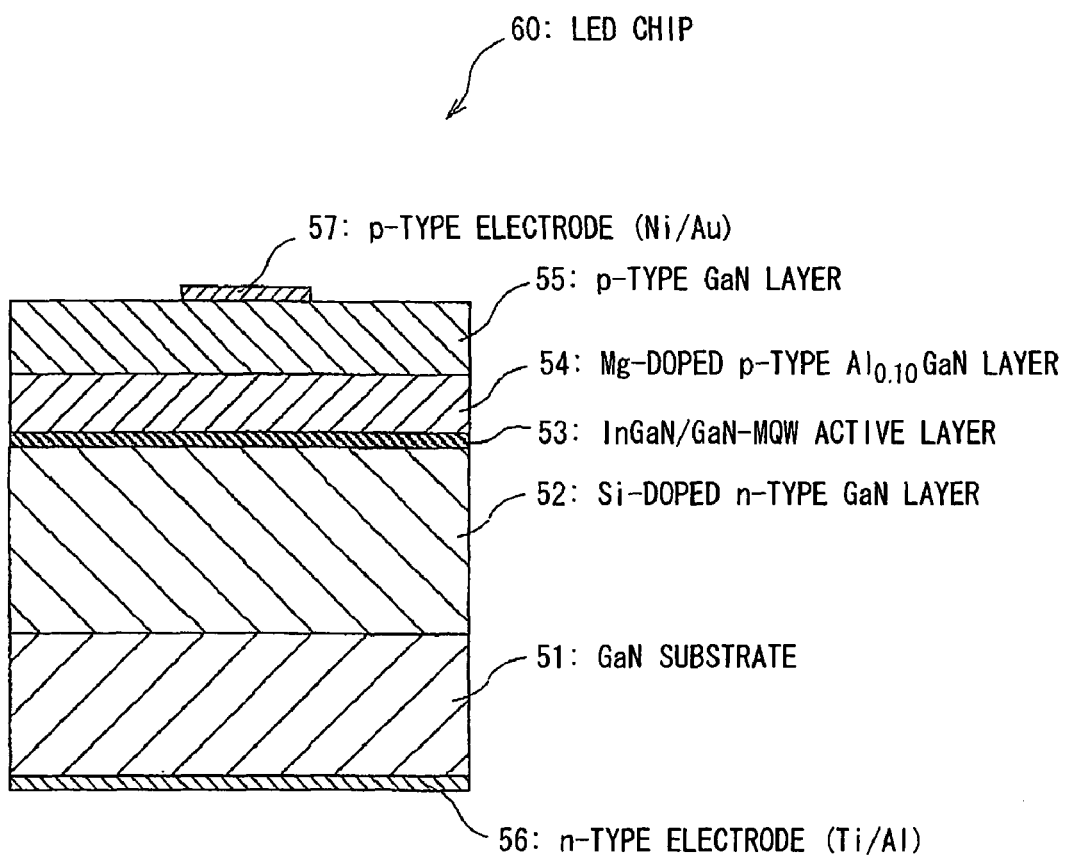
FIG. 10 is a cross sectional view showing an LED fabricated in Comparative Examples 1-2 and Examples 1-3.

On the GaN freestanding substrate 50 (wafer) made as described above, an LED epitaxial layer structure as shown in FIG. 10 was grown and then diced into chips. The chips were evaluated on in-plane distribution of LED characteristics.

The LED epitaxial layer structure was grown by using a MOVPE growth system. The raw materials used for the growth are TMG (trimethylgallium), TMA (trimethylaluminum), TMI (trimethylindium) and $NH_3$. The growth was conducted such that temperature of the substrate is increased to 1150° C. in a mixed gas stream of $NH_3$:hydrogen=1:1, it is held five minutes after the temperature is stabilized, and the group III material required for the growth of the first layer is introduced. The grown epitaxial layer structure comprises, in order from a GaN substrate 51 (corresponding to the GaN freestanding substrate 50 in wafer), a 1 μm thick Si-doped n-type GaN layer 52, a $In_{0.15}Ga_{0.85}N$/GaN-3-MQW active layer 53 (comprising a 3 nm thick well layer and a 10 nm thick barrier layer), a 40 μm thick Mg-doped p-type $Al_{0.1}Ga_{0.9}N$ layer 54, and a 500 nm thick p-type GaN layer 55. The growth temperature of the MQW layer was reduced to 800° C. The growth temperature of the other layers was 1150° C. The growth pressure was always normal pressure. After the epitaxial layer was grown, an n-type electrode (Ti/Al) 56 formed of Ti/Al was formed on the back surface of the GaN substrate 51 and a p-type electrode 57 formed of Ni/Au was formed on the surface of the p-type GaN layer 55.

In evaluation, the LED chip thus fabricated had a driving voltage Vf widely varied in the range of 3.25 to 6.02 V in plane of the substrate when feeding current of 20 mA, and there was a tendency that the nearer the outer circumference of the substrate 50 the chip is taken, the more the Vf is increased. Assuming that a chip with a Vf<3.5 V is an acceptable product, the ratio of the acceptable product in the substrate was 45%. Further, in conducting a reliability test driven at a constant current, there was a tendency that the nearer the outer circumference of the substrate the chip is taken, the larger the variation range of emission output becomes.

Example 1

(where the minimum value of the impurity concentration is not less than $5 \times 10^{17}$ $cm^{-3}$ and the in-plane amplitude is not more than $2 \times 10^{18}$ $cm^{-3}$)

A GaN freestanding substrate was made under the same conditions as Comparative Example 1 except using the improved HVPE reactor 20 as shown in FIG. 2.

Figure 11:
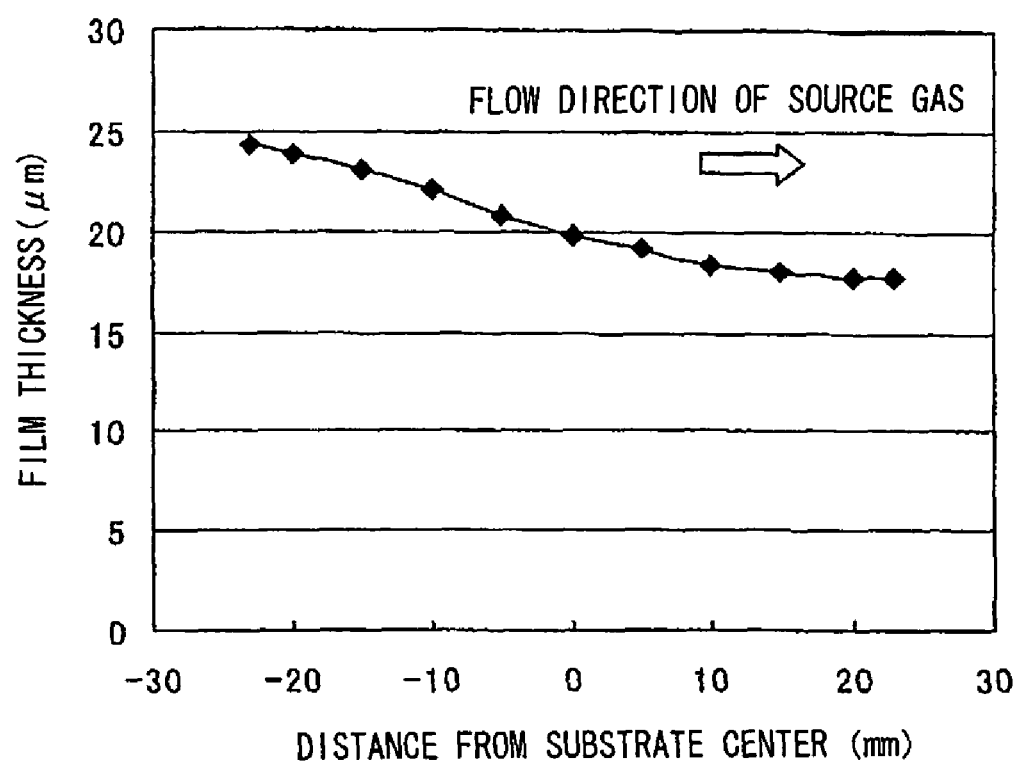
FIG. 11 is a graph showing a distribution in thickness of a GaN film grown by HVPE without rotating a base substrate in Example 1.
Figure 12:
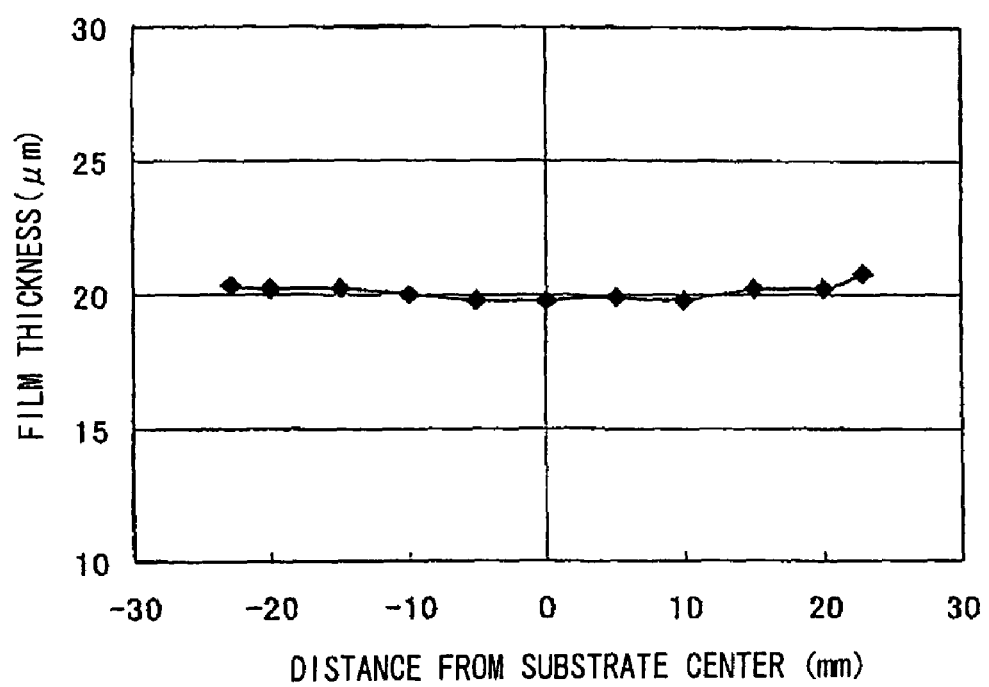
FIG. 12 is a graph showing a distribution in thickness of a GaN film grown by HVPE while rotating the base substrate in Example 1.

FIGS. 11 and 12 are graphs showing a distribution of the film thickness of a GaN crystal grown by using the improved HVPE reactor shown in FIG. 2.

In case of FIG. 11, the GaN crystal is grown intentionally without rotating the substrate so as to confirm a distribution of the growth rate in the flow direction of the raw material gas. In the conventional HVPE reactor as shown in FIG. 1, the gallium chloride is exhausted during the crystal growth of GaN and the source concentration (GaCl) lowers as it goes downstream. However, in Example 1, by inclining the substrate relative to the gas flow direction, the tendency of the growth rate reduced on the downstream side as found in Comparative Example 1 can be significantly suppressed.

FIG. 12 is a graph showing a distribution of the film thickness of the GaN crystal grown rotating the base substrate at 10 rpm under the same growth conditions as described above. By rotating the base substrate, the difference between the upstream and downstream growth rates in the source gas flow is averaged so that the surface can be almost flattened.

Under the same conditions as Comparative Example 1, a GaN freestanding substrate was produced by using the using the improved HVPE reactor shown in FIG. 2.

Then, nine samples with a size of 5 mm square were cut linearly along the diameter of the substrate 50, and they were each provided with In (indium) electrodes to measure the carrier concentration by the van der Pauw method. As the result of the measurement, the measured values fell within $1.2 \pm 0.1 \times 10^{18}$ $cm^{-3}$.

Figure 13:
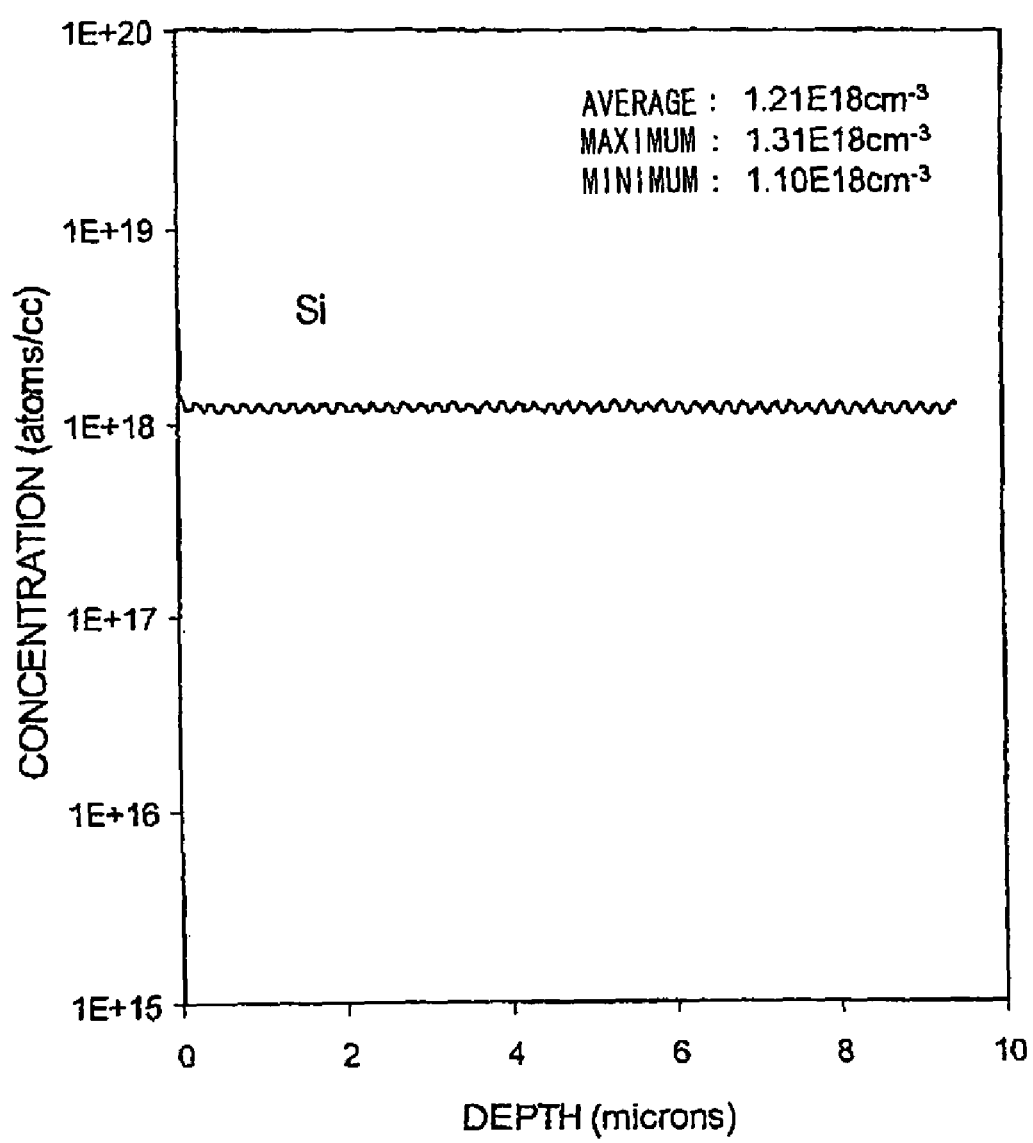
FIG. 13 is a graph showing a Si concentration profile at the center of a GaN freestanding substrate crystal produced in Example 1.
Figure 14:
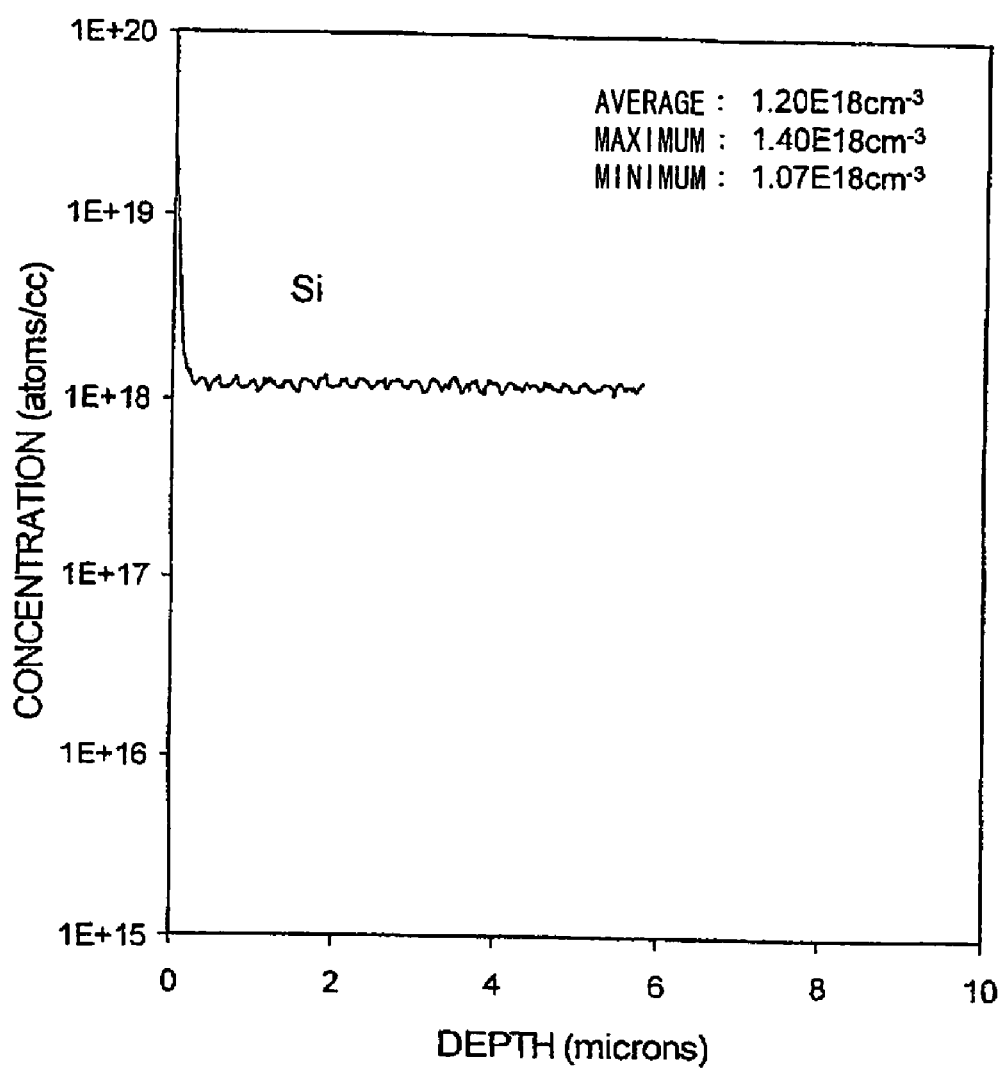
FIG. 14 is a graph showing a Si concentration profile at a point 10 mm away from the center of the GaN freestanding substrate crystal produced in Example 1.
Figure 15:
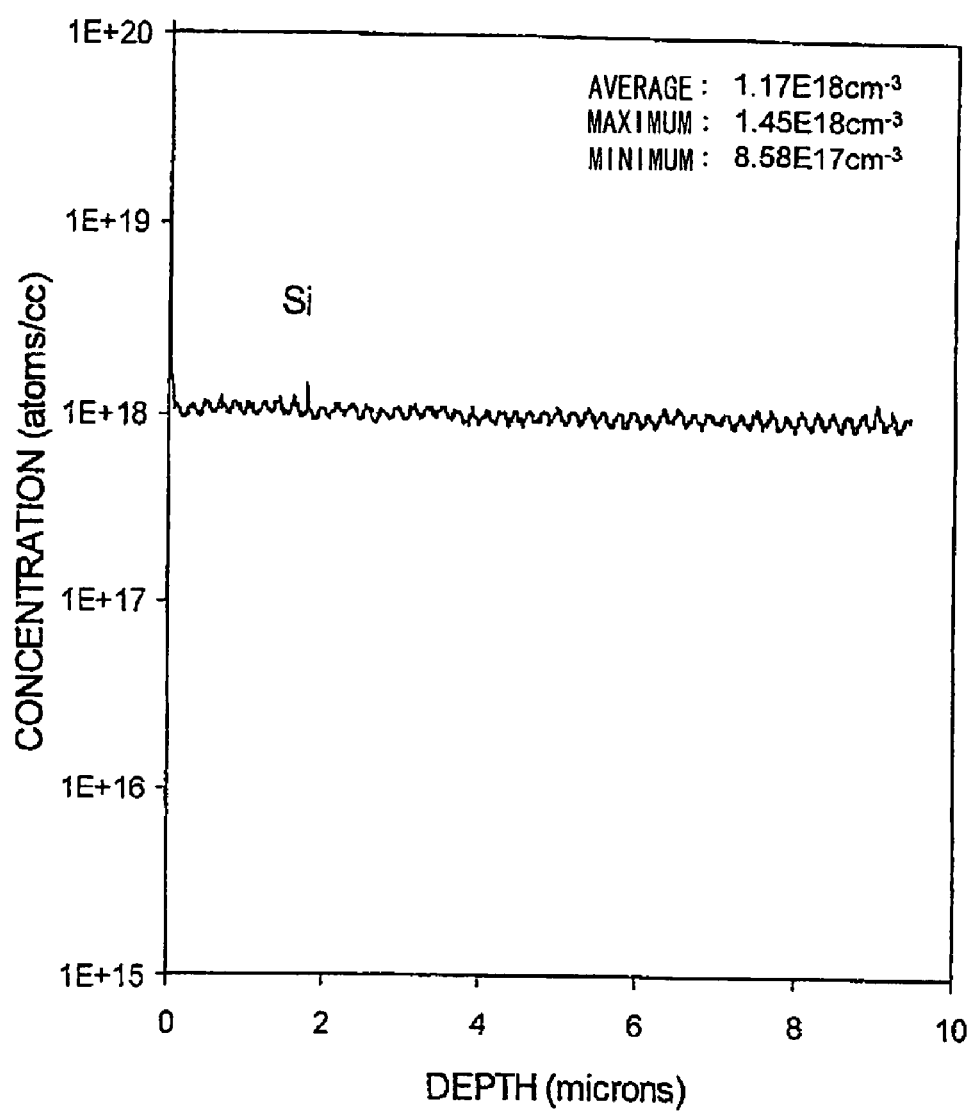
FIG. 15 is a graph showing a Si concentration profile at a point 20 mm away from the center of the GaN freestanding substrate crystal produced in Example 1.

Next, a Si concentration distribution in the thickness direction of the substrate was measured for samples which were cut at the center of the substrate, at a point 10 mm away from the center, and at a point 20 mm away from the center, respectively. FIGS. 13 to 15 show the SIMS measurement results at the center of the substrate, at a point 10 mm away from the center, and at a point 20 mm away from the center, respectively.

FIG. 13 is a graph showing a profile of the Si concentration at the center of the GaN freestanding substrate. With respect to the in-depth distribution of the Si concentration measured for the sample cut at the central of the substrate, in measurement down to about 10 μm depth, the maximum value was $1.31 \times 10^{18}$ $cm^{-3}$, the minimum value was $1.10 \times 10^{18}$ $cm^{-3}$, and the average value was $1.21 \times 10^{18}$ $cm^{-3}$. Assuming that an amplitude in variation of the Si concentration is determined by (the maximum concentration)–(the minimum concentration), the amplitude was $2.10 \times 10^{17}$ $cm^{-3}$.

FIG. 14 is a graph showing a profile of the Si concentration at a point 10 mm away from the center of the GaN freestanding substrate. With respect to the in-depth distribution of the Si concentration measured for the sample cut at the point 10 mm away from the center of the substrate, in measurement down to about 10 μm depth, the maximum value was $1.40 \times 10^{18}$ $cm^{-3}$, the minimum value was $1.07 \times 10^{18}$ $cm^{-3}$, and the average value was $1.20 \times 10^{18}$ $cm^{-3}$. Thus, the amplitude of the Si concentration at this measurement point was $3.3 \times 10^{17}$ $cm^{-3}$.

FIG. 15 is a graph showing a profile of the Si concentration at a point 20 mm away from the center of the GaN freestanding substrate. With respect to the in-depth distribution of the Si concentration measured for the sample cut at the point 10 mm away from the center of the substrate, no change was found as compared to that at the center of the substrate. In measurement down to about 10 μm depth, the maximum value was $1.45 \times 10^{18}$ $cm^{-3}$, the minimum value was $8.58 \times 10^{17}$ $cm^{-3}$, and the average value was $1.17 \times 10^{18}$ $cm^{-3}$. Thus, the amplitude of the Si concentration at this measurement point was $5.92 \times 10^{17}$ $cm^{-3}$.

From the above results, there is a tendency that the nearer the outer circumference of the substrate, the larger the amplitude of the Si concentration becomes gradually. However, it is assumed that, in this substrate, the amplitude of the Si concentration at any points in plane of the substrate is suppressed in the order of $10^{17}$ $cm^{-3}$, judging from the fact that the amplitude of the Si concentration at the center of the substrate was $2.10 \times 10^{17}$ $cm^{-3}$ and the amplitude at the point 20 mm away from the center (i.e., at a point 5 mm away from the outermost circumference) was $5.92 \times 10^{17}$ $cm^{-3}$.

On the GaN freestanding substrate made as described above, an LED epitaxial layer structure as shown in FIG. 10 was grown as described in Comparative Example 1 and then diced into chips. The chips are evaluated on in-plane distribution of LED characteristics.

In evaluation, the LED chip thus fabricated had a relatively uniform driving voltage Vf in the range of 3.25 to 3.55 V in plane of the substrate when feeding current of 20 mA. Thus, the Vf distribution was observed almost uniform at any points in plane of the substrate. Assuming that a chip with a Vf<3.5 V is an acceptable product, the ratio of the acceptable product in the substrate was 98%. Further, in conducting a reliability test driven at a constant current, everywhere from the substrate the chip is taken, no significant variation in emission output was found.

Example 2

(where the minimum value of the impurity concentration is not less than $5 \times 10^{17}$ cm$^{-3}$ but the in-plane amplitude is more than $2 \times 10^{18}$ cm$^{-3}$)

A GaN freestanding substrate was made under the same conditions as Comparative Example 1 by using the HVPE reactor 10 as shown in FIG. 1. The difference from Comparative Example 1 is that the flow rate of dichlorosilane as a dopant gas was increased to allow the minimum value of the Si concentration not to be less than $5 \times 10^{17}$ cm$^{-3}$ even at the outer circumference of the crystal. As a result, in observing the crystal surface after the completion of the growth, minute irregularities were formed especially on the side of the outer circumference of the crystal. Both surfaces of the crystal are polished as in Comparative Example 1, nine samples with a size of 5 mm square were cut linearly along the diameter of the substrate thus obtained, and they were each provided with In (indium) electrodes so as to measure the carrier concentration by the van der Pauw method. The carrier concentration fell within $1.6 \pm 0.1 \times 10^{18}$ cm$^{-3}$ which is slightly greater than that in Comparative Example 1.

Next, a Si concentration distribution in the thickness direction of the substrate was measured for the samples which were cut at the center of the substrate, at a point 10 mm away from the center, and at a point 20 mm away from the center, respectively.

In the in-depth distribution of the Si concentration measured for the sample cut at the center of the substrate, variation was not so much as expected, and in measurement down to about 6 μm in depth, the maximum value was $1.71 \times 10^{18}$ cm$^{-3}$, the minimum value was $1.48 \times 10^{18}$ cm$^{-3}$, and the average value was $1.61 \times 10^{18}$ cm$^{-3}$. Thus, the amplitude of the Si concentration distribution was $2.30 \times 10^{17}$ cm$^{-3}$.

In the in-depth distribution of the Si concentration measured for the sample cut at the point 10 mm away from the center of the substrate, variation was slightly greater than that at the center of the substrate, and the maximum value was $2.19 \times 10^{18}$ cm$^{-3}$, the minimum value was $1.08 \times 10^{18}$ cm$^{-3}$, and the average value was $1.63 \times 10^{18}$ cm$^{-3}$. Thus, the amplitude of the Si concentration at this measurement point was $1.11 \times 10^{18}$ cm$^{-3}$.

In the in-depth distribution of the Si concentration measured for the sample cut at the point 20 mm away from the center of the substrate, variation was further greater than that at the center of the substrate, and the maximum value was $3.61 \times 10^{18}$ cm$^{3}$, the minimum value was $8.25 \times 10^{17}$ cm$^{-3}$, and the average value was $1.60 \times 10^{18}$ cm$^{-3}$. Thus, the amplitude of the Si concentration at this measurement point was $2.79 \times 10^{18}$ cm$^{-3}$.

Therefore, it can be concluded that this substrate is not more than about $2.79 \times 10^{18}$ cm$^{-3}$ in amplitude of the Si concentration at any points in plane of the surface.

On the GaN freestanding substrate made as described above, an LED epitaxial layer structure as shown in FIG. 10 was grown as described in Comparative Example 1 and then diced into chips. The chips are evaluated on in-plane distribution of LED characteristics.

In evaluation, the LED chip thus fabricated had a relatively uniform driving voltage Vf in the range of 3.35 to 3.81 V in plane of the substrate when feeding current of 20 mA. Thus, the Vf distribution was observed almost uniform at any points in plane of the substrate. Assuming that a chip with a Vf<3.5 V is an acceptable product, the ratio of the acceptable product in the substrate was 91%. However, there was a tendency that the emission output of the LED is low at the outer circumference of the substrate. Further, in conducting a reliability test driven at a constant current, there was a tendency that variation in emission output is increased along with approach to the outer circumference.

Example 3

(where the minimum value of the impurity concentration is not less than $5 \times 10^{17}$ cm$^{-3}$ but the in-plane amplitude is not more than $2 \times 10^{18}$ cm$^{-3}$)

A GaN freestanding substrate was made under the same conditions as Example 1 by using the HVPE reactor 20 as shown in FIG. 2. The difference from Example 1 is that the inclination angle of the substrate holder 29 is reduced to 5. Nine samples with a size of 5 mm square were cut linearly along the diameter of the substrate thus obtained, and they were each provided with In (indium) electrodes so as to measure the carrier concentration by the van der Pauw method. The carrier concentration fell within $1.5 \pm 0.2 \times 10^{18}$ cm$^{-3}$ which is substantially equal to that in Example 1.

Next, a Si concentration distribution in the thickness direction of the substrate was measured for the samples which were cut at the center of the substrate, at a point 10 mm away from the center, and at a point 20 mm away from the center, respectively.

In the in-depth distribution of the Si concentration measured for the sample cut at the center of the substrate, in measurement down to about 10 μm in depth, the maximum value was $1.69 \times 10^{18}$ cm$^{-3}$, the minimum value was $1.28 \times 10^{18}$ cm$^{-3}$, and the average value was $1.49 \times 10^{18}$ cm$^{-3}$. Thus, the amplitude of the Si concentration distribution was $4.1 \times 10^{17}$ cm$^{-3}$.

In the in-depth distribution of the Si concentration measured for the sample cut at the point 10 mm away from the center of the substrate, the maximum value was $2.16 \times 10^{18}$ cm$^{-3}$, the minimum value was $8.62 \times 10^{17}$ cm$^{-3}$, and the average value was $1.51 \times 10^{18}$ cm$^{-3}$. Thus, the amplitude of the Si concentration at this measurement point was $1.30 \times 10^{18}$ cm$^{-3}$.

In the in-depth distribution of the Si concentration measured for the sample cut at the point 20 mm away from the center of the substrate, the maximum value was $2.44 \times 10^{18}$ cm$^{-3}$, the minimum value was $5.43 \times 10^{17}$ cm$^{-3}$, and the average value was $1.51 \times 10^{18}$ cm$^{-3}$. Thus, the amplitude of the Si concentration at this measurement point was $1.90 \times 10^{18}$ cm$^{-3}$.

Therefore, it can be concluded that this substrate is not more than about $2.79 \times 10^{18}$ cm$^{-3}$ in amplitude of the Si concentration at any points in plane of the surface.

From the above results, a tendency can be found that the nearer the outer circumference of the substrate, the larger the amplitude of the Si concentration becomes gradually. Thus, it is assumed that this substrate has such a distribution that the amplitude of the Si concentration can be barely within $2 \times 10^{18}$ cm$^{-3}$ in plane of the substrate.

On the GaN freestanding substrate made as described above, an LED epitaxial layer structure as shown in FIG. 10 was grown as described in Comparative Example 1 and then diced into chips. The chips are evaluated on in-plane distribution of LED characteristics.

In evaluation, the LED chip thus fabricated had a relatively uniform driving voltage Vf in the range of 3.30 to 3.77 V in plane of the substrate when feeding current of 20 mA. Thus, the Vf distribution was observed almost uniform at any points in plane of the substrate. Assuming that a chip with a Vf<3.5 V is an acceptable product, the ratio of the acceptable product in the substrate was 92%. There was a tendency that the emission output of the LED is low at the outer circumference of the substrate. Further, in conducting a reliability test driven at a constant current, there was a tendency that variation in emission output is increased along with approach to the outer circumference. However, a problematic abnormal behavior was not observed all the while.

Comparative Example 2

(where the minimum value of the impurity concentration is less than $5 \times 10^{17}$ cm$^{-3}$ but the in-plane amplitude is more than $2 \times 10^{18}$ cm$^{-3}$)

A GaN freestanding substrate was made under the same conditions as Comparative Example 1 by using the HVPE reactor 30 with the simultaneous multi-growth type susceptor (i.e., substrate holder 29) as shown in FIG. 3.

Nine samples with a size of 5 mm square were cut linearly along the diameter of the substrate thus obtained, and they were each provided with In (indium) electrodes so as to measure the carrier concentration by the van der Pauw method. The carrier concentration fell within $1.1 \pm 0.2 \times 10^{18}$ cm$^{-3}$ which is substantially equal to that in Example 1.

Next, a Si concentration distribution in the thickness direction of the substrate was measured for the samples which were cut at the center of the substrate, at a point 10 mm away from the center, and at a point 20 mm away from the center, respectively.

In the in-depth distribution of the Si concentration measured for the samples cut at all points from the center to the outer circumference, large variation was observed. At the center of the substrate, in measurement down to about 6 μm in depth, the maximum value was $3.09 \times 10^{18}$ cm$^{-3}$, the minimum value was $3.89 \times 10^{17}$ cm$^{-3}$, and the average value was $1.13 \times 10^{18}$ cm$^{-3}$. Thus, the amplitude of the Si concentration distribution was $2.70 \times 10^{18}$ cm$^{-3}$.

In the in-depth distribution of the Si concentration measured for the sample cut at the point 10 mm away from the center of the substrate, the maximum value was $3.03 \times 10^{18}$ cm$^{-3}$, the minimum value was $4.10 \times 10^{17}$ cm$^{-3}$, and the average value was $1.13 \times 10^{18}$ cm$^{-3}$. Thus, the amplitude of the Si concentration at this measurement point was $2.62 \times 10^{18}$ cm$^{-3}$.

In the in-depth distribution of the Si concentration measured for the sample cut at the point 20 mm away from the center of the substrate, the maximum value was $3.21 \times 10^{18}$ cm$^{-3}$, the minimum value was $3.35 \times 10^{17}$ cm$^{-3}$, and the average value was $1.15 \times 10^{18}$ cm$^{-3}$. Thus, the amplitude of the Si concentration at this measurement point was $2.87 \times 10^{18}$ cm$^{-3}$.

Therefore, it can be concluded that this substrate is not more than about $2.87 \times 10^{18}$ cm$^{-3}$ in amplitude of the Si concentration at any points in plane of the surface.

On the GaN freestanding substrate made as described above, an LED epitaxial layer structure as shown in FIG. 10 was grown as described in Comparative Example 1 and then diced into chips. The chips are evaluated on in-plane distribution of LED characteristics.

In evaluation, the LED chip thus fabricated had a driving voltage Vf widely varied in the range of 3.31 to 5.83 V in plane of the substrate when feeding current of 20 mA, and there was a tendency that the Vf is averagely high all over the surface. Assuming that a chip with a Vf<3.5 V is an acceptable product, the ratio of the acceptable product in the substrate was only 15%. Further, in conducting a reliability test driven at a constant current, there was a tendency that variation of emission output is generally large regardless of the chip-taken points in plane of the substrate.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in Examples 1 and 2, by using the improved HVPE reactor 20 as shown in FIG. 2, a periodical change in impurity introduction into the crystal can be suppressed. However, even when using the conventional HVPE reactor 10 as shown in FIG. 1 (as in Example 2), the in-depth distribution of the impurity concentration can be equalized by, e.g., increasing the flow rate of the raw materials excessively, where difference in growth rate between the upstream and downstream positions of the source gas flow can be reduced although the utilization efficiency of the source gas must be reduced. In brief, it is really important to reduce the variation of the impurity concentration in the depth direction of the substrate, where it doesn't matter which means is used for it.

What is claimed is:

1. A group III-V nitride-based semiconductor substrate, comprising:
   a group III-V nitride-based semiconductor single crystal containing an n-type impurity,
   wherein the single crystal comprises a repetitive, periodical change in concentration of the n-type impurity in a thickness direction of the substrate, and
   the periodical change comprises a minimum value in concentration of the n-type impurity not less than $5 \times 10^{17}$ cm$^{-3}$ at an arbitrary point in plane of the substrate.

2. The group III-V nitride-based semiconductor substrate according to claim 1, wherein:
   the periodical change comprises an amplitude being not more than $2 \times 10^{18}$ cm$^{-3}$ at an arbitrary point in plane of the substrate.

3. The group III-V nitride-based semiconductor substrate according to claim 1, wherein:
   the group III-V nitride-based semiconductor single crystal comprises a hexagonal gallium nitride.

4. The group III-V nitride-based semiconductor substrate according to claim 3, wherein:
   the substrate comprises on a surface thereof a gallium face on a C-face of the hexagonal gallium nitride.

5. The group III-V nitride-based semiconductor substrate according to claim 1, wherein:
   the substrate comprises a mirror-polished surface.

6. The group III-V nitride-based semiconductor substrate according to claim 1, wherein:
   the n-type impurity comprises silicon.

7. The group III-V nitride-based semiconductor substrate according to claim 1, wherein:
   the n-type impurity comprises oxygen.

8. The group III-V nitride-based semiconductor substrate according to claim 1, wherein:
   the substrate comprises a diameter not less than 50 mm.

9. A group III-V nitride-based light emitting device, comprising:
   the group III-V nitride-based semiconductor substrate according to claim 1, and
   an active layer formed on the substrate, the active layer comprising a group III-V nitride-based semiconductor.

10. A group III-V nitride-based light emitting device, comprising:
    the group III-V nitride-based semiconductor substrate according to claim 2, and
    an active layer formed on the substrate, the active layer comprising a group III-V nitride-based semiconductor.

11. A group III-V nitride-based light emitting device, comprising:
   the group III-V nitride-based semiconductor substrate according to claim 3, and
   an active layer formed on the substrate, the active layer comprising a group III-V nitride-based semiconductor.

12. A group III-V nitride-based light emitting device, comprising:
   the group III-V nitride-based semiconductor substrate according to claim 4, and
   an active layer formed on the substrate, the active layer comprising a group III-V nitride-based semiconductor.

13. A group III-V nitride-based light emitting device, comprising:
   the group III-V nitride-based semiconductor substrate according to claim 5, and
   an active layer formed on the substrate, the active layer comprising a group III-V nitride-based semiconductor.

14. A group III-V nitride-based light emitting device, comprising:
   the group III-V nitride-based semiconductor substrate according to claim 6, and
   an active layer formed on the substrate, the active layer comprising a group III-V nitride-based semiconductor.

15. A group III-V nitride-based light emitting device, comprising:
   the group III-V nitride-based semiconductor substrate according to claim 7, and
   an active layer formed on the substrate, the active layer comprising a group III-V nitride-based semiconductor.

16. A group III-V nitride-based light emitting device, comprising:
   the group III-V nitride-based semiconductor substrate according to claim 8, and
   an active layer formed on the substrate, the active layer comprising a group III-V nitride-based semiconductor.

* * * * *